(12) United States Patent
Khoo et al.

(10) Patent No.: US 9,754,834 B2
(45) Date of Patent: Sep. 5, 2017

(54) METHOD OF ELECTRICALLY ISOLATING LEADS OF A LEAD FRAME STRIP BY LASER BEAM CUTTING

(71) Applicant: Infineon Technologies AG, Neubiberg (DE)

(72) Inventors: Nee Wan Khoo, Melaka (MY); Vigneswaran Letcheemana, Ipoh Perak (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/254,454

(22) Filed: Sep. 1, 2016

(65) Prior Publication Data
US 2016/0372374 A1 Dec. 22, 2016

Related U.S. Application Data

(62) Division of application No. 14/077,742, filed on Nov. 12, 2013, now Pat. No. 9,437,458.

(51) Int. Cl.
*H01L 21/46* (2006.01)
*H01L 21/78* (2006.01)
(Continued)

(52) U.S. Cl.
CPC .......... *H01L 21/78* (2013.01); *B23K 26/362* (2013.01); *B23K 26/40* (2013.01); *B23K 26/402* (2013.01); *H01L 21/4825* (2013.01); *H01L 21/4842* (2013.01); *H01L 21/561* (2013.01); *B23K 2201/40* (2013.01); *B23K 2203/166* (2015.10); *B23K 2203/50* (2015.10); *H01L 22/14* (2013.01); *H01L 24/97* (2013.01); *H01L 2924/12042* (2013.01)

(58) Field of Classification Search
CPC ........ H01L 21/00; H01L 21/50; H01L 23/495
USPC .......................... 257/666; 438/106, 113, 127
See application file for complete search history.

(56) References Cited

U.S. PATENT DOCUMENTS

| 5,599,413 A | 2/1997 | Nakao et al. |
|---|---|---|
| 6,573,121 B2 | 6/2003 | Yoneda et al. |

(Continued)

FOREIGN PATENT DOCUMENTS

| JP | H11150143 A | 6/1999 |
|---|---|---|
| TW | 461057 B | 10/2001 |

*Primary Examiner* — Kimberly Rizkallah
*Assistant Examiner* — Brian Turner
(74) *Attorney, Agent, or Firm* — Murphy, Bilak & Homiller, PLLC

(57) ABSTRACT

A lead frame strip includes a plurality of connected unit lead frames, each unit lead frame having a die paddle and a plurality of leads connected to a periphery of the unit lead frame. A semiconductor die is attached to each of the die paddles, the unit lead frames are covered with a molding compound after the semiconductor dies are attached to the die paddles, and a laser beam is directed at regions of the periphery of each unit lead frame where the leads are located thereby forming spaced apart cuts in the periphery of each unit lead frame. The spaced apart cuts sever the leads from the periphery of each unit lead frame and extend at least partially into the molding compound in the regions of the periphery where the leads are located so that the molding compound remains intact between the spaced apart cuts.

6 Claims, 9 Drawing Sheets

(51) Int. Cl.
*H01L 21/301* (2006.01)
*H01L 21/44* (2006.01)
*H01L 21/50* (2006.01)
*H01L 21/48* (2006.01)
*B23K 26/362* (2014.01)
*B23K 26/40* (2014.01)
*B23K 26/402* (2014.01)
*H01L 21/56* (2006.01)
*H01L 21/66* (2006.01)
*H01L 23/00* (2006.01)
*B23K 101/40* (2006.01)
*B23K 103/16* (2006.01)
*B23K 103/00* (2006.01)

(56) References Cited

U.S. PATENT DOCUMENTS

| | | |
|---|---|---|
| 7,087,461 B2 | 8/2006 | Park et al. |
| 8,551,820 B1 | 10/2013 | Foster et al. |
| 2005/0001292 A1* | 1/2005 | Hatauchi ............ H01L 23/3107 257/666 |
| 2005/0110010 A1 | 5/2005 | Winter et al. |
| 2005/0214980 A1 | 9/2005 | Shiu et al. |
| 2005/0218499 A1 | 10/2005 | Chang et al. |
| 2005/0287709 A1* | 12/2005 | Lee ........................ H01L 21/56 438/122 |
| 2006/0231937 A1 | 10/2006 | Juskey et al. |
| 2007/0092991 A1 | 4/2007 | Masumoto |
| 2007/0161157 A1 | 7/2007 | Islam et al. |
| 2007/0184658 A1 | 8/2007 | Koyata et al. |
| 2008/0188015 A1 | 8/2008 | Sangaunwong et al. |
| 2008/0254392 A1 | 10/2008 | Yang |
| 2010/0003894 A1 | 1/2010 | Miller et al. |
| 2012/0208323 A1* | 8/2012 | Heinrich ................ H01L 24/83 438/123 |
| 2012/0252142 A1 | 10/2012 | Abbott |
| 2012/0274014 A1 | 11/2012 | Byars |
| 2012/0306065 A1 | 12/2012 | Bin Mohd Arshad |
| 2013/0120019 A1 | 5/2013 | Gibbs et al. |
| 2014/0035113 A1 | 2/2014 | Kierse |
| 2015/0064849 A1 | 3/2015 | Khoo et al. |

* cited by examiner

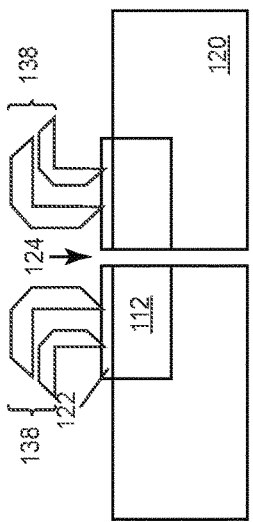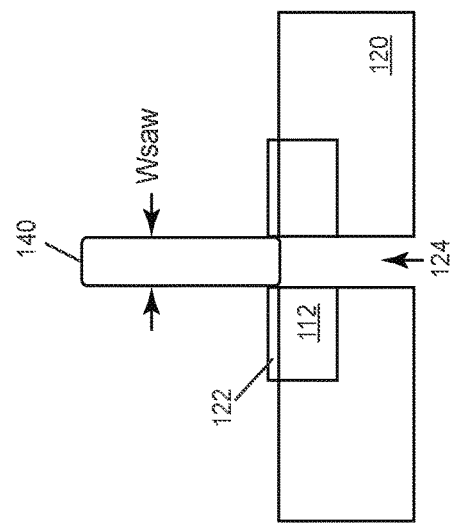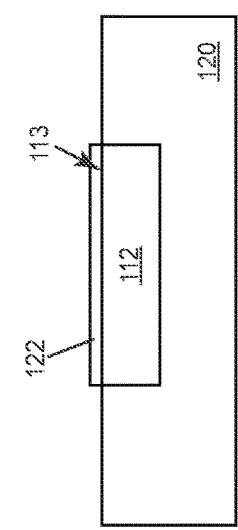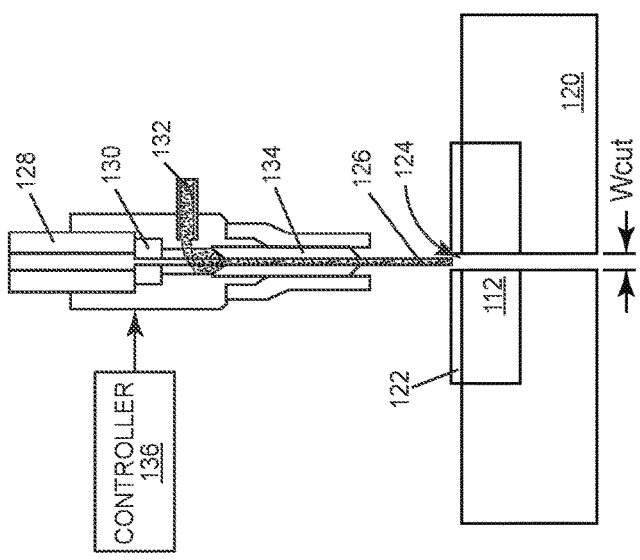

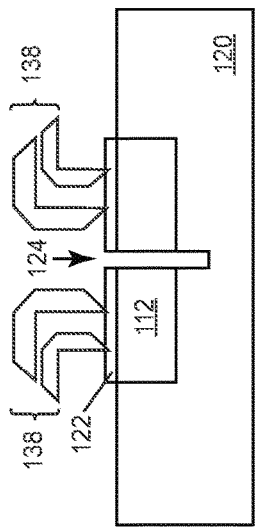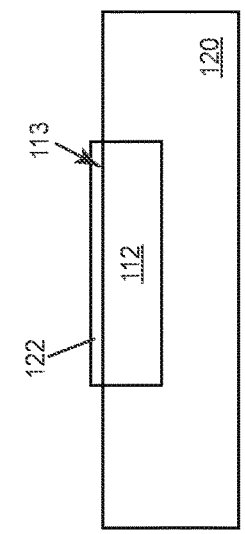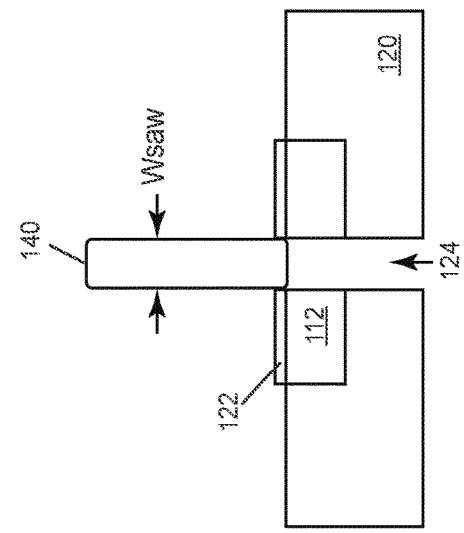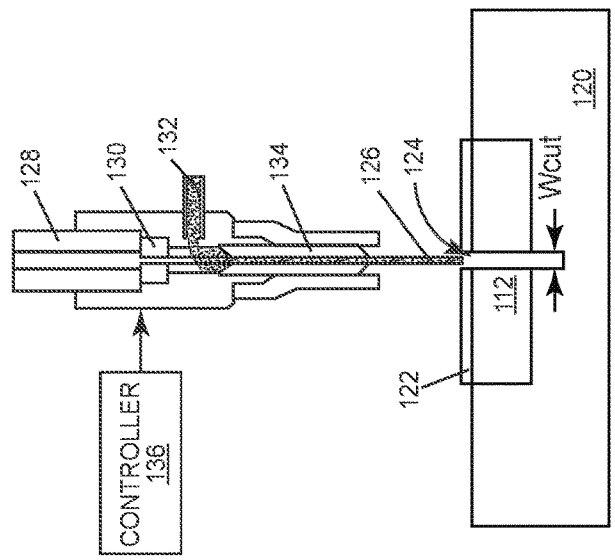

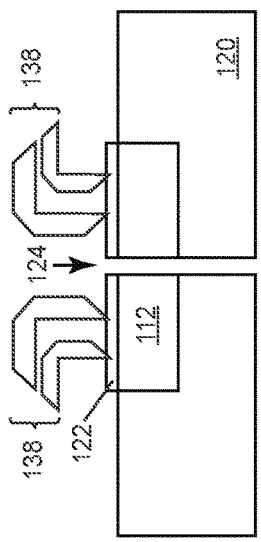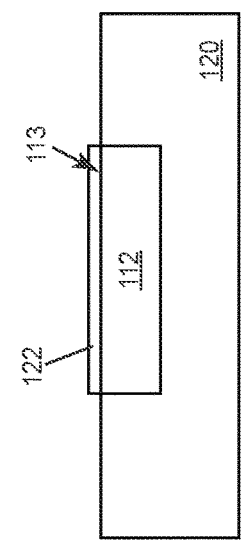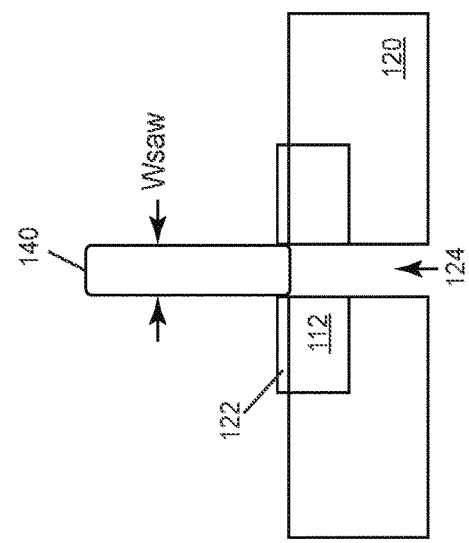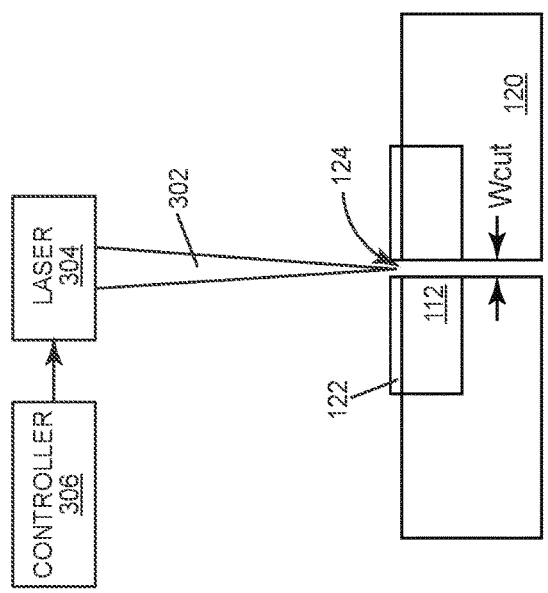

METHOD OF ELECTRICALLY ISOLATING LEADS OF A LEAD FRAME STRIP BY LASER BEAM CUTTING

TECHNICAL FIELD

The instant application relates to lead frame strips, and more particularly to electrical isolation of the leads of a lead frame strip during lead frame strip processing.

BACKGROUND

A lead frame forms the base or skeleton of an IC package, providing mechanical support to semiconductor dies during assembly into a finished package. A lead frame typically includes a die paddle for attaching a semiconductor die, and leads providing the means for external electrical connection to the die. The die can be connected to the leads by wires, e.g. through wire bonding or tape automated bonds. Lead frames are typically constructed from flat sheet metal, e.g. by stamping or etching. The sheet metal is typically exposed to chemical etchants that remove areas not covered by photoresist. After the etching process, the etched frames are singulated (separated) into lead frame strips. Each lead frame strip includes a number of unit lead frames each having the die paddle and lead construction described above.

Semiconductor dies attached to the die paddles after completion of the assembly process of a lead frame strip are usually tested after separation of the unit lead frames from the lead frame strip, e.g. by punching. Alternatively, the unit lead frames remain mechanically connected to the lead frame strip by tie bars during die testing. This is commonly referred to as lead frame strip testing. Separation of the unit lead frames from the lead frame strip occurs after electrical testing. However, the devices must be electrically isolated from one another during lead frame strip testing. Conventional processing involves cutting about half-way through the entire periphery of each unit lead frame to sever the leads, leaving a thin part of molding compound intact in the periphery to hold the units in place during lead frame strip testing. However, such processing increases wearing of the sawing blade which can cause inaccuracy. Also, rigidity of the lead frame strip decreases after the half-cut process, especially for thin packages. In addition, a long cycle time is needed to perform the half-cut on the entire lead frame strip, increasing the cost of the individual packages produced from the lead frame strip.

SUMMARY

A lead frame strip includes a plurality of connected unit lead frames, each unit lead frame having a die paddle and a plurality of leads connected to a periphery of the unit lead frame. According to an embodiment of a method of processing the lead frame strip, the method comprises: attaching a semiconductor die to each of the die paddles; covering the unit lead frames with a molding compound after the semiconductor dies are attached to the die paddles; forming spaced apart cuts in the periphery of each unit lead frame that sever the leads from the periphery of each unit lead frame and extend at least partially into the molding compound in regions of the periphery where the leads are located so that the molding compound remains intact between the cuts; and processing the lead frame strip after the cuts are formed in the periphery of each unit lead frame.

The unit lead frames can be arranged in a plurality of rows and columns with the leads extending toward the die paddles along two opposing sides of the die paddles. According to this embodiment, the method of processing the lead frame strip comprises: attaching a semiconductor die to each of the die paddles; covering the unit lead frames with a molding compound after the semiconductor dies are attached to the die paddles; cutting a single line extending horizontally through the periphery of the unit lead frames between the rows to sever the leads from the periphery of each unit lead frame; processing the lead frame strip after cutting the single line between adjacent rows of the unit lead frames; and cutting a single line extending vertically through the periphery of the unit lead frames between the columns after the processing of the lead frame strip to separate the unit lead frames into individual packages.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A through 2D illustrate different stages of an embodiment of a method of severing the leads of a lead frame strip using a pressurized liquid stream.

FIGS. 3A through 3D illustrate different stages of another embodiment of a method of severing the leads of a lead frame strip using a pressurized liquid stream.

FIGS. 7A through 7D illustrate different stages of another embodiment of a method of severing the leads of a lead frame strip using a laser beam.

DETAILED DESCRIPTION

According to embodiments described herein, spaced apart cuts are formed around the periphery of each unit lead frame of a lead frame strip to electrically isolate the leads for subsequent processing such as lead frame strip testing, partial plating, electrical charging, etc. A molding compound encapsulating the unit lead frame remains at least partly intact between the cuts to provide rigidity to the lead frame strip during the subsequent processing. The unit lead frames are later separated from the lead frame strip into individual packages.

Figure 1:
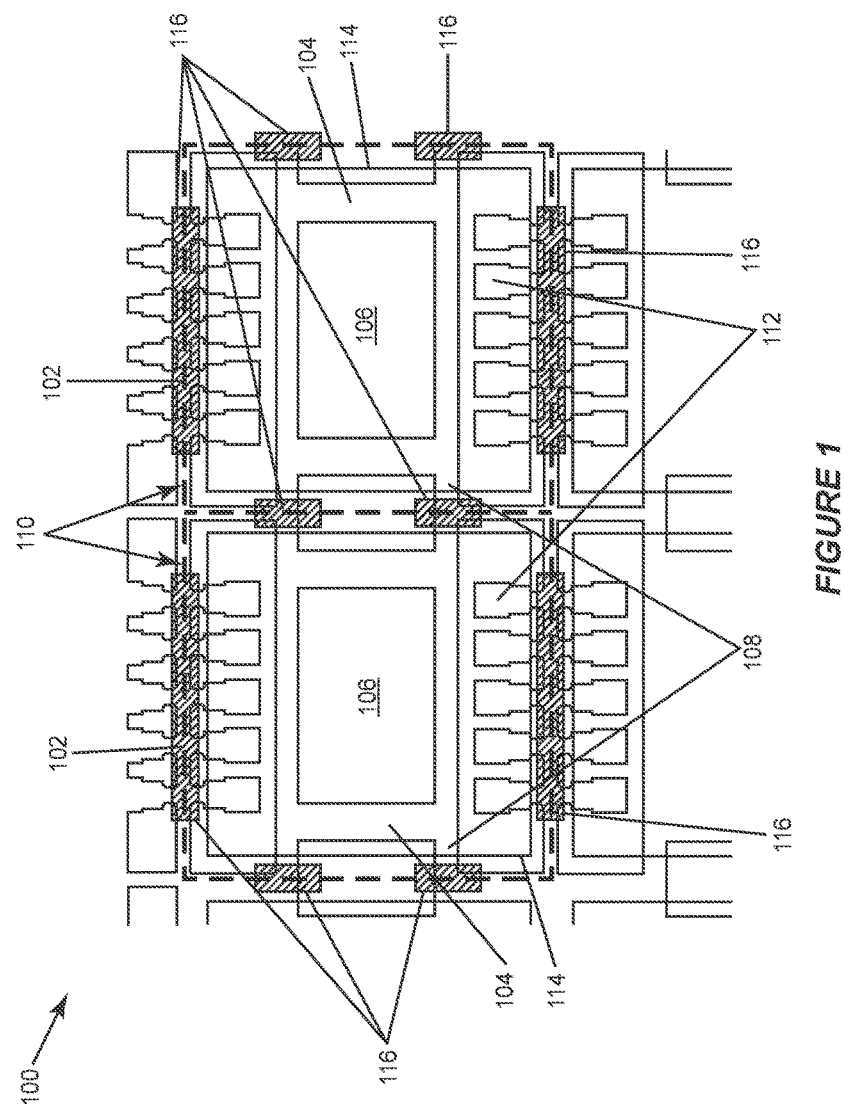
FIG. 1 illustrates a plan view of a lead frame strip with regions targeted for cutting to sever the leads of the lead frame strip, according to an embodiment.

FIG. 1 illustrates a top plan view of part of a lead frame strip 100 according to an embodiment. The lead frame strip 100 includes a plurality of connected unit lead frames 102, two of which are shown in FIG. 1. Each unit lead frame 102 has a die paddle 104 for attaching one or more semiconductor dies 106, tie bars 108 connecting the die paddle 104 to the periphery 110 of the unit lead frame 102, and a plurality of leads 112 projecting from the periphery 110 toward the die paddle 104. The boxes labeled 114 in FIG. 1 represent the final size of the individual packages to be later produced upon separation from the lead frame strip 100.

In one embodiment, the lead frame strip 100 is constructed from flat sheet metal, e.g. by stamping or etching. For example, the sheet metal can be exposed to chemical etchants that remove areas not covered by photoresist. Other processing can be performed, e.g. laser etching to pattern the sheet metal. After the patterning process, the patterned frames are singulated (separated) into lead frame strips. One such lead frame strip 100 is shown in FIG. 1.

Electrical connections (not shown for ease of illustration) are formed between the leads 112 of each unit lead frame 102 and terminals of the semiconductor dies 106 attached to the die paddles 104. The unit lead frames 102 and the semiconductor dies 106 are then encapsulated with a molding compound to form individual packages. The molding compound is not shown in FIG. 1 for ease of illustration. More than one die paddle 104 can be included in each individual package, and the individual packages are later physically separated into individual units.

Prior to testing of the semiconductor dies 106 attached to the die paddles 104 or other processing such as partial plating, electrical charging, etc., spaced apart cuts are formed in the periphery 110 of each unit lead frame 102 of the lead frame strip 100 to electrically isolate the leads 112 of each unit lead frame 102 for subsequent processing. The regions to be cut are labeled 116 in FIG. 1.

FIGS. 2A through 2D illustrate an embodiment of a method of forming the spaced apart cuts in the periphery 110 of each unit lead frame 102 of the lead frame strip 100. FIG. 2A shows a cross-sectional view of part of a unit lead frame 102 in the periphery 110 where a lead 112 is located. The side 113 of the lead 112 uncovered by a molding compound 120 can be plated 122 e.g. with silver, tin, palladium, etc. The other sides of the lead 112 and the unit lead frames 102 of the lead frame strip 100, including the semiconductor dies 106 attached to the die paddles 104 of the lead frame strip 100, are covered by the molding compound 120.

FIG. 2B shows the lead 112 during the cutting process. According to this embodiment, spaced apart cuts 124 are formed in the periphery 110 of each unit lead frame 102 by directing a pressurized liquid stream 126 at the regions 116 of the periphery 110 of each unit lead frame 102 where the leads 112 are located to cut through the leads 112 and the molding compound 120 in these regions 116.

More particularly, a water cutting tool includes a high pressure water inlet 128, a jewel 130 such as ruby or diamond, an inlet 132 for adding an abrasive, and a mixing tube 134 for producing a cohesive liquid mix of high-pressure water and abrasive. The pressurized liquid stream 126 is directed at the regions 116 of the periphery 110 of each unit lead frame 102 where the leads 112 are located to cut through the leads 112 and the molding compound 120 in these regions 116 via the pressurized liquid stream 126. Movement of the water cutting tool is controlled by a controller 136. The controller 136 is programmed to move the water cutting tool in x and y directions and control the rate of movement. In one embodiment, the rate of movement of the water cutting tool is varied around the periphery 110 of each unit lead frame 102 so that the pressurized liquid stream 126 is directed at the regions 116 of the periphery 110 where the leads 112 are located for a longer period of time than in other regions around the periphery 110. As a result, the leads 112 and the molding compound 120 are cut through in the regions 116 of the periphery 110 where the leads 112 are located and the molding compound 120 remains at least partly intact in other regions around the periphery 110 to provide rigidity during subsequent processing of the lead frame strip 100. The spaced apart cuts 124 can also act as a stress relief mechanism for reducing warpage of the lead frame strip 100 during handling.

FIG. 2C shows one embodiment of such processing, in which the severed leads 112 are contacted by probes 138 to test the semiconductor dies 106 attached to the die paddles 104 of the unit lead frames 102. Because the leads 112 have been severed from the periphery 100 of the respective unit lead frames 102 by a pressurized liquid stream 126, the semiconductor dies 106 can be tested in parallel using any standard lead frame strip testing methodology without interference between the dies 106. The molding compound 120 remains at least partly intact between the cuts 124 so that the lead frame strip 100 remains solid and robust for handling.

FIG. 2D shows the severed lead 112 during a sawing process in which the entire periphery 110 of each unit lead frame 102 is cut by a saw blade 140 after testing of the lead frame strip 100, to separate the unit lead frames 102 into individual package units. Conventional saw blades typically have a width (Wsaw) of at least 0.3 mm and more typically about 0.45 mm. The spaced apart cuts 124 formed in the periphery 110 of each unit lead frame 102 by the pressurized liquid stream 126 have a width (Wcut) of 0.25 mm or less e.g. down to a minimum of 0.12 mm. As such, the width (Wcut) of the cuts 124 made by the pressurized liquid stream 126 is narrower than the width (Wsaw) of the saw blade 140. Severing the leads 112 with such narrower cuts 124 yields additional lead area for contacting by the test probes 138 during lead frame strip testing as compared to severing the leads 112 using a saw blade. This is particularly beneficial for power devices subjected to high current kelvin testing e.g. where two probes per pad are used as shown in FIG. 2C. Also, the use of a water cutting tool instead of a saw blade to sever the leads 112 for lead frame strip testing or other processing reduces saw blade wear and tear, yielding more constant and accurate lead frame strip processing and faster process time due to cutting only selected regions 116 instead of the entire periphery 110 of each unit lead frame 102.

FIGS. 3A through 3D illustrate another embodiment of a method of forming the spaced apart cuts 124 in the periphery 110 of each unit lead frame 102 of the lead frame strip 100. FIG. 3A shows a cross-sectional view of part of a unit lead frame 102 in the periphery 110 where a lead 112 is located, FIG. 3B shows the lead 112 during the water cutting process, FIG. 3C shows the severed lead 112 during testing, and FIG. 3D shows the severed lead 112 during a sawing process which separates the unit lead frames 102 into individual package units. The embodiment shown in FIGS. 3A through 3D is similar to the embodiment show in FIGS. 2A through 2D, however, the pressurized liquid stream 126 is controlled such that the cuts 124 sever the leads 112 in the targeted regions 116 of the periphery 110 of each unit lead frame and extend only partially into the molding compound 120 in these regions 116 so that the molding compound 120 remains partly intact below the cuts 124. In one embodiment, the rate of movement of the water cutting tool is controlled so that the molding compound 120 is not cut through in the cut regions 116.

Figure 4:
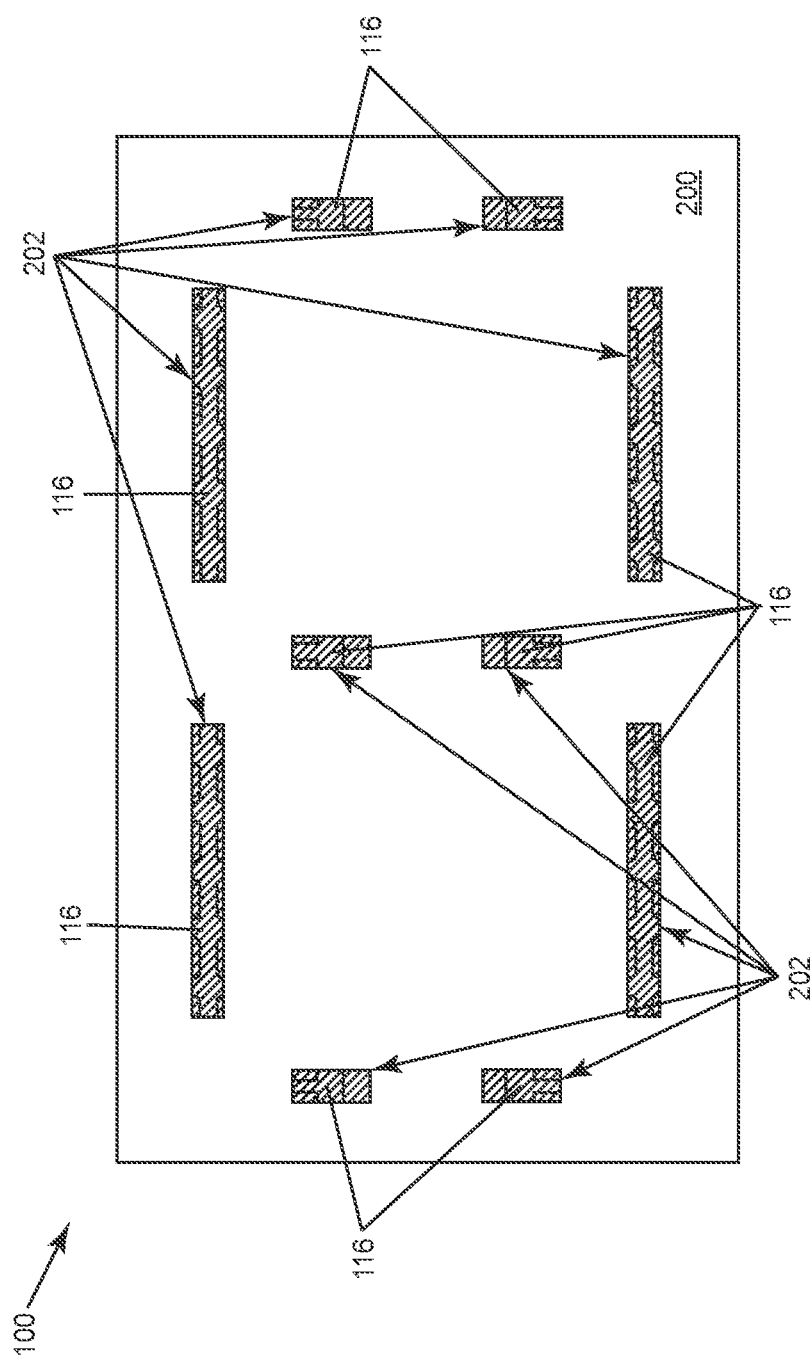
FIG. 4 illustrates a plan view of a mask placed on a lead frame strip with cutouts that expose regions targeted for cutting to sever the leads of the lead frame strip, according to an embodiment.

FIG. 4 illustrates a top plan view of the part of the lead frame strip 100 shown in FIG. 1, with a mask 200 placed on the lead frame strip 100 prior to severing of the leads 112 by a pressurized liquid stream 126. The mask 200 covers the unit lead frames 102 and is made of a relatively hard material such as carbonite or ceramic. The mask 200 has cutouts 202 over the regions 116 of the periphery 110 of each unit lead frame 102 where the leads 112 are located, so that the pressurized liquid stream 126 is blocked from cutting regions of the molding compound 120 protected by the mask 200. The mask 200 can be used in addition to, or instead of, varying the rate of movement of the water cutting tool by the controller 136. Without the mask 200, the rate of movement of the water cutting tool is varied as previously described herein to ensure that the molding compound 120 is not cut completely through by the pressurized liquid stream 124 in regions not covering the leads 112. Otherwise, the entire periphery 110 of each unit lead frame 102 would be cut completely through by the pressurized liquid stream 126 and the stability of the lead frame strip 100 would be significantly reduced. With the mask 200, the variable rate control of the movement of the water cutting tool can be optionally implemented or instead omitted. With both variable rate control of the pressurized liquid stream 124 and the mask 200, the pressurized liquid stream 126 is directed at the cutouts 202 in the mask 200 for a longer period of time than at the mask 200.

Figure 5:
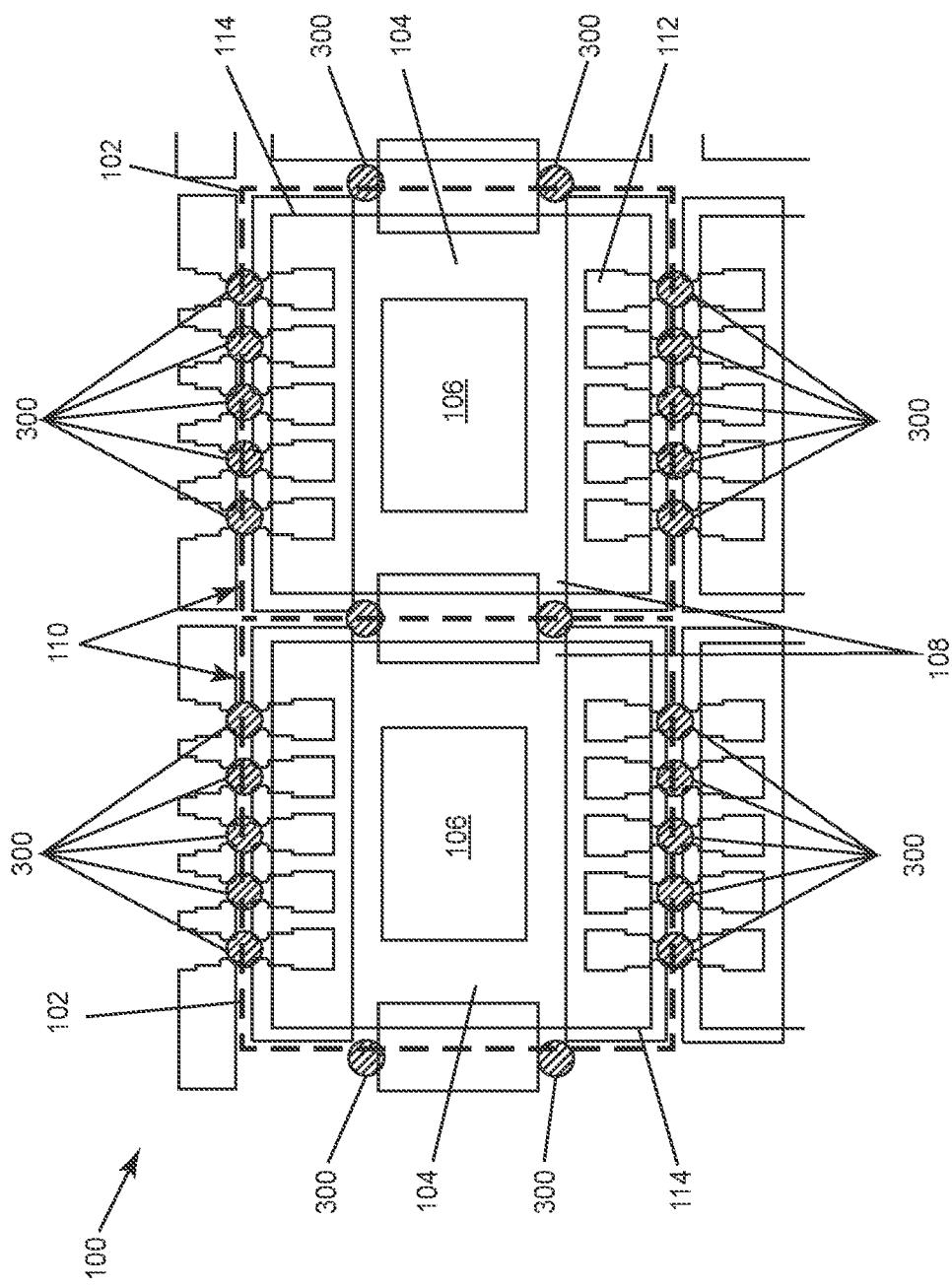
FIG. 5 illustrates a plan view of a lead frame strip with regions targeted for cutting to sever the leads of the lead frame strip, according to another embodiment.

FIG. 5 illustrates a top plan view of part of a lead frame strip 100 according to another embodiment. The embodiment shown in FIG. 5 is similar to the embodiments shown in FIGS. 1 through 4, however, the spaced apart cuts 124 are formed in the periphery 110 of each unit lead frame 102 of the lead frame strip 100 using a laser beam to electrically isolate the leads 112 for subsequent processing. The regions to be cut by laser beam are labeled 300 in FIG. 1. Smaller regions 300 are targeted for laser beam cutting as compared to FIG. 1, leaving more of the molding compound 120 intact post severing of the leads 112.

Figure 6A:
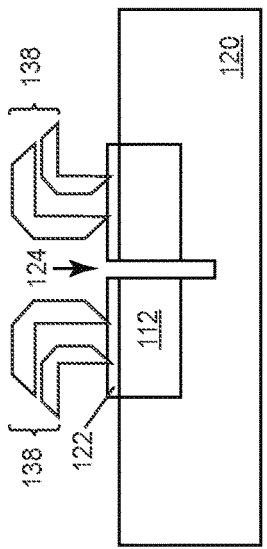
FIGS. 6A through 6D illustrate different stages of an embodiment of a method of severing the leads of a lead frame strip using a laser beam.

FIGS. 6A through 6D illustrate an embodiment of a method of forming the spaced apart cuts 124 in the periphery 110 of each unit lead frame 102 of the lead frame strip 100 using a laser beam 302. FIG. 6A shows a cross-sectional view of part of a unit lead frame 102 in the periphery 110 where a lead 112 is located. The side 113 of the lead 112 uncovered by the molding compound 120 can be plated 122 e.g. with silver, tin, palladium, etc. The other sides of the lead 112 and the unit lead frames 102 of the lead frame strip 100, including the semiconductor dies 106 attached to the die paddles 104, are covered by a molding compound 120.

Figure 6C:
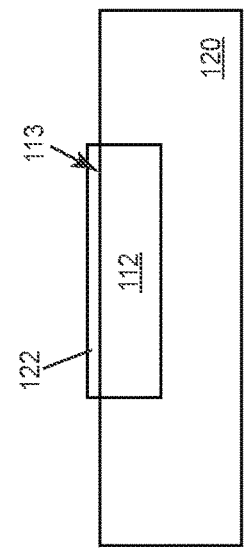
Figure 6B:
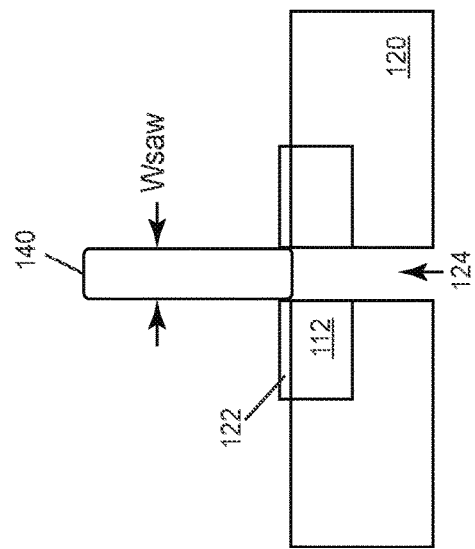

FIG. 6B shows the lead during the cutting process. According to this embodiment, the spaced apart cuts 124 are formed in the periphery 110 of each unit lead frame 102 by directing a laser beam 302 at the regions 300 of the periphery 110 of each unit lead frame 102 where the leads 112 are located to cut through the leads 112 and at least part of the molding compound 120 in these regions 300.

More particularly, a laser cutting tool includes a laser 304 for generating and directing a laser beam 302 towards the lead frame strip 100. The laser beam 302 is directed at the regions 300 of the periphery 110 of each unit lead frame 102 where the leads 112 are located to cut through the leads 112 and at least some of the molding compound 120 in these regions 300 via the laser beam 302. Movement of the laser 304 is controlled by a controller 306. The controller 306 is programmed to move the laser 304 in x and y directions and control the lasing operation so that the laser beam 302 is directed only at the regions 300 of the periphery 110 where the leads 112 are located. As a result, the leads 112 are cut through and at least some of the molding compound 120 removed in the targeted regions 300 of the periphery 110 where the leads 112 are located. The molding compound 120 remains completely intact in other regions around the periphery between the cuts 124 to provide rigidity during subsequent processing of the lead frame strip 100.

FIG. 6C shows one embodiment of post-lasing processing, in which the severed leads 112 are contacted by probes 138 to test the semiconductor dies 106 attached to the die paddles 104 of the unit lead frames 102. Because the leads 112 have been severed at the periphery 110 of the respective unit lead frames 102 by the laser tool, the semiconductor dies 106 can be tested in parallel using any standard lead frame strip testing methodology without interference between the dies 106. The molding compound 120 remains fully intact between the cuts 124 so that the lead frame strip remains solid and robust during handling. Optionally, the molding compound 120 in these regions between the cuts 124 can be partly lased to remove some of the molding compound 120 in order to reduce warpage of the lead frame strip 100 during subsequent handling.

Figure 6D:
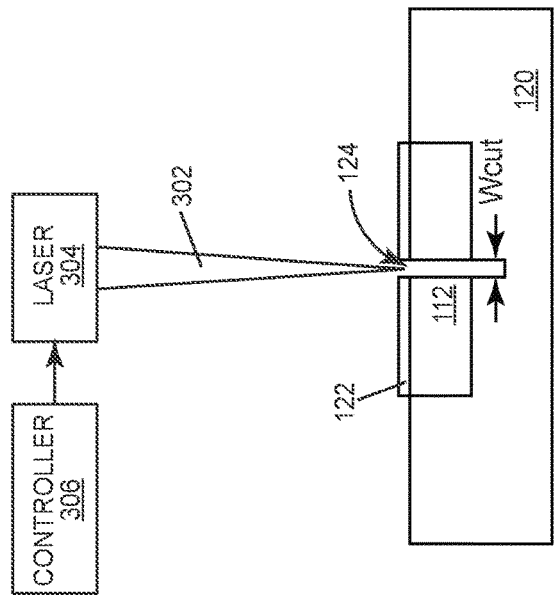

FIG. 6D shows the lead 112 during a sawing process in which the entire periphery 110 of each unit lead frame 102 is cut by a saw blade 140 after testing of the lead frame strip testing, to separate the unit lead frames 102 into individual package units. The spaced apart cuts 124 formed in the periphery 110 of each unit lead frame 102 by the laser beam 302 have a width (Wcut) of 0.25 mm or less e.g. down to 0.12 mm or less depending on the type of laser cutting tool. As such, the width (Wcut) of the cuts 124 made in the periphery 110 of each unit lead frame 102 by the laser beam 302 is narrower than the width (Wsaw) of the saw blade 140. This yields additional lead area for contacting by the probes 138 during lead frame strip testing as previously described herein.

FIGS. 7A through 7D illustrate another embodiment of a method of forming the spaced apart cuts 124 in the periphery 110 of each unit lead frame 102 of the lead frame strip 100 using a laser beam 302. FIG. 7A shows a cross-sectional view of part of a unit lead frame 102 in the periphery 110 where a lead 112 is located, FIG. 7B shows the lead 112 during the laser cutting process, FIG. 7C shows the severed lead 112 during testing, and FIG. 7D shows the severed lead during a sawing process which separates the unit lead frames 102 into individual package units. The embodiment shown in FIGS. 7A through 7D is similar to the embodiment show in FIGS. 6A through 6D, however, the molding compound 120 is cut through instead of partly removed in the regions 300 of the periphery 110 where the lasing occurs according to this embodiment. The amount of molding compound 120 lased in the targeted regions 300 can be controlled by the power level, focal point and length of lasing. The controller 306 can be programmed to precisely control one or more of these parameters so that the desired regions 300 and materials are lased to sever the leads 112, including cutting through the molding compound 120 in these regions 300.

Each of the embodiments previously described herein relates to severing the leads 112 from the periphery 110 of unit lead frames 102 of a lead frame strip 100 to ensure proper electrical isolation of the leads 112 e.g. during lead frame strip testing. In some packages, the die paddles 104 should also be disconnected from the periphery 110 by severing the tie bars 108 that attach the die paddles 104 to the periphery 110 to ensure complete electrical isolation of individual packages during lead frame strip testing. Otherwise, the die paddles 104 remain electrically connected to the lead frame strip 100 by the tie bars 108 during testing. This is problematic for applications where the die paddles 104 serve an electrical connection function, e.g. in DSO (dual small outline) packages where the exposed die paddles 104 provide an electrical connection to the backside of semiconductor dies 106 attached to the die paddles 104.

In this case, the tie bars 108 electrically short the die paddles 104 to the lead frame strip 100 and to other die paddles 104 attached to the same lead frame strip 100, complicating the electrical testing process. Electrical isolation may also be required for other lead frame processing such as partial plating and electrical charge processes. As such, the regions 116/300 targeted for cutting e.g. by a pressurized liquid stream 126 or laser beam 302 as previously described herein can include both the leads 112 and the tie bars 108 as shown in FIGS. 1 and 5. The cutting process employed severs both the leads 112 and the tie bars 108 in the targeted regions 116/300 according to this embodiment, completely electrically isolating the packages from one another. The lead frame strip 100 is then subsequently processed e.g. by lead frame strip testing, partial plating, electrical charging, etc. after the tie bars 108 are severed by the additional cuts.

Figure 8A:
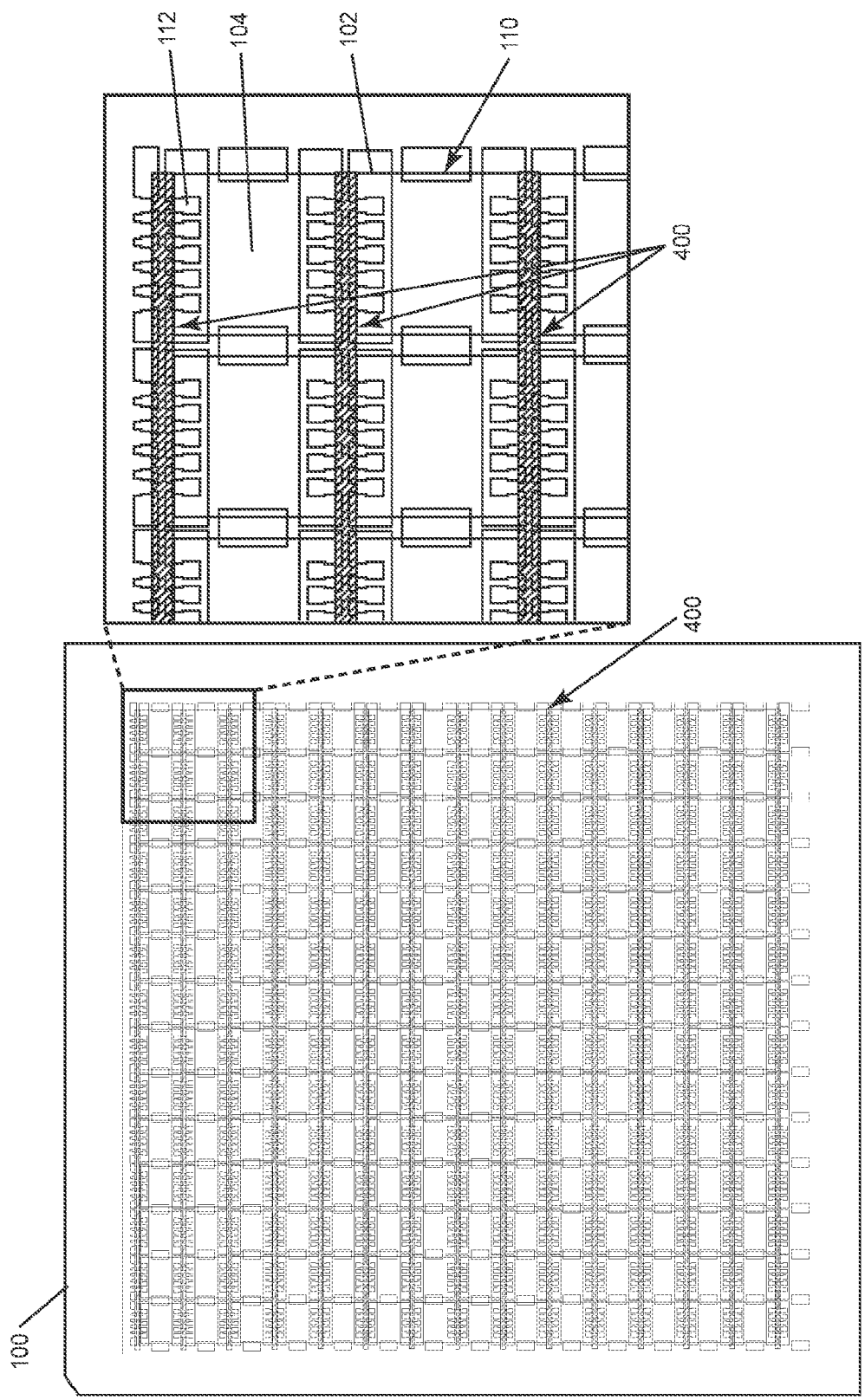
FIGS. 8A and 8B illustrate different stages of an embodiment of a method of severing the leads of a lead frame strip having rows and columns of unit lead frames with the leads extending toward die paddles of the unit lead frames along two opposing sides of the die paddles.
Figure 8B:
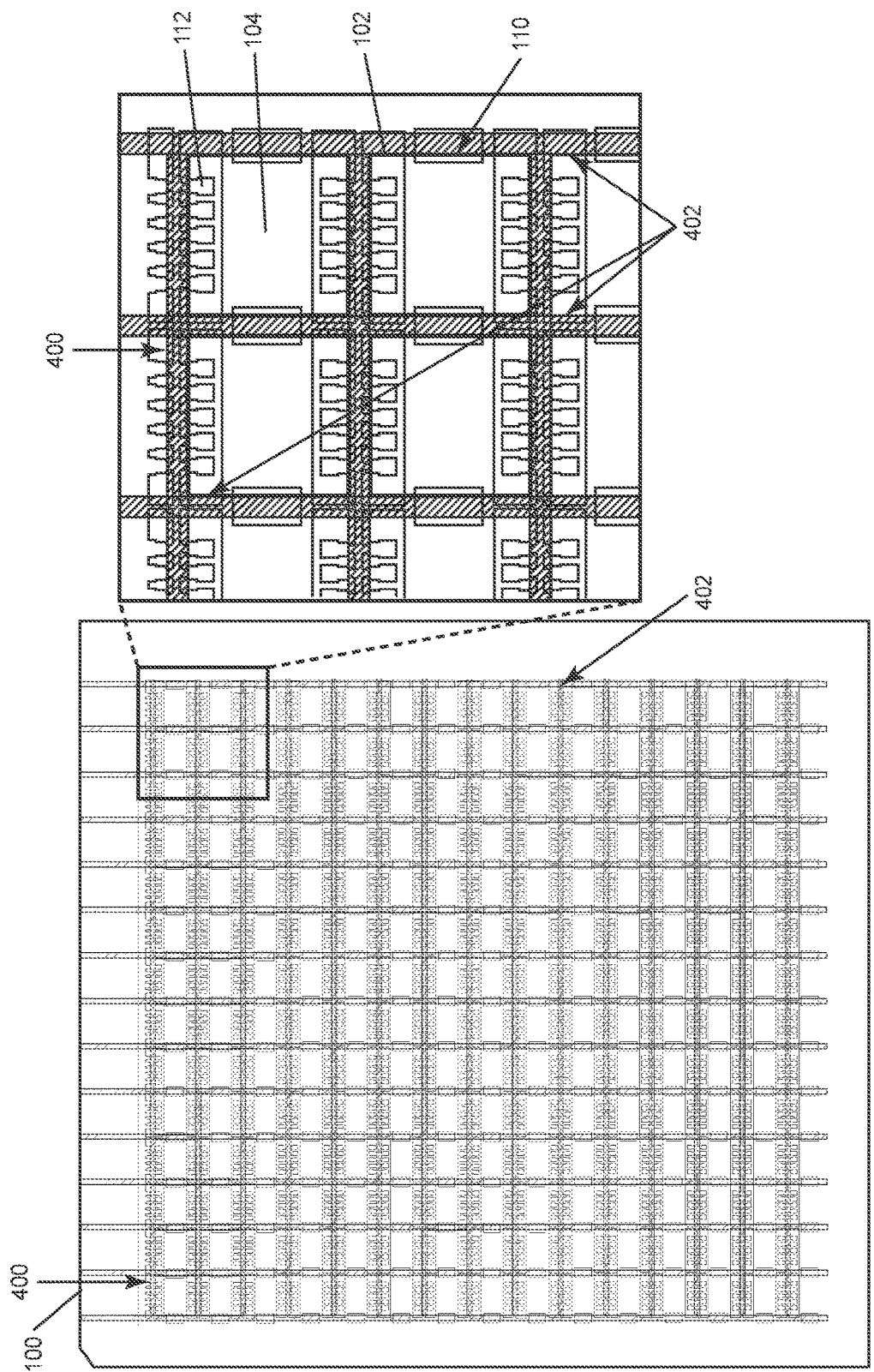

FIGS. 8A and 8B illustrate yet another embodiment of severing the leads 112 of a lead frame strip 100 to provide electrical isolation during subsequent processing of the lead frame strip 100. According to this embodiment, the unit lead frames 102 are arranged in a plurality of rows and columns with the leads 112 extending toward the die paddles 104 along two opposing sides of the die paddles 104. After the unit lead frames 102 with the semiconductor dies (not shown in FIGS. 8A and 8B for ease of illustration) are covered with a molding compound (also not shown in FIGS. 8A and 8B for ease of illustration), a single line 400 extending horizontally through the periphery 110 of each unit lead frame 102 is cut between the rows to sever the leads 112 from the periphery 110 of the unit lead frames 102 as shown in FIG. 8A. The horizontal cutting regions are labeled 400 in FIG. 8A.

In one embodiment, the single lines 400 extending horizontally through the periphery 110 of the unit lead frames 102 between the rows are cut by directing a pressurized liquid stream 126 in a single line extending horizontally between the rows as previously described herein. A mask 200 may or may not be used also as previously described herein. In another embodiment, the single lines 400 extending horizontally through the periphery 110 of the unit lead frames 102 between the rows are cut by sawing along a single line extending horizontally between the rows using a saw blade 140. In either case, the lead frame strip 100 is then subsequently processed e.g. by lead frame strip testing, partial plating, electrical charging, etc. after cutting the single lines 400 between adjacent rows of the unit lead frames 102.

After this processing, a single line 402 extending vertically through the periphery 110 of the unit lead frames 102 is cut between the columns to separate the unit lead frames 102 into individual package units. The vertical cutting regions are labeled 402 in FIG. 8B. In one embodiment, the single lines 400 extending horizontally through the periphery 110 of the unit lead frames 102 and the single lines 402 extending vertically through the periphery 110 of the unit lead frames 102 are cut using a saw blade. In another embodiment, the single lines 400 extending horizontally through the periphery 110 of the unit lead frames 102 are cut using a pressurized liquid stream 126 and the single lines 402 extending vertically through the periphery 110 of the unit lead frames 102 between the columns are cut using a saw blade 140 having a wider width than the single lines 400 formed by the pressurized liquid stream 126.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of processing a lead frame strip including a plurality of connected unit lead frames, each unit lead frame having a die paddle and a plurality of leads connected to a periphery of the unit lead frame, the method comprising:
    attaching a semiconductor die to each of the die paddles;
    covering the unit lead frames with a molding compound after the semiconductor dies are attached to the die paddles;
    directing a laser beam at regions of the periphery of each unit lead frame where the leads are located thereby forming spaced apart cuts in the periphery of each unit lead frame, the spaced apart cuts severing the leads from the periphery of each unit lead frame and extending at least partially into the molding compound in the regions of the periphery where the leads are located so that the molding compound remains intact between the spaced apart cuts; and
    processing the lead frame strip after the spaced apart cuts are formed in the periphery of each unit lead frame; and
    cutting the entire periphery of each unit lead frame by a saw blade after processing the lead frame strip, to separate the unit lead frames into individual packages, wherein a width of the spaced apart cuts made in the periphery of each unit lead frame by the laser beam is narrower than the width of the saw blade.

2. The method of claim 1, wherein the laser beam also cuts through the molding compound in the regions of the periphery of each unit lead frame where the leads are located.

3. The method of claim 1, wherein the width of the spaced apart cuts made in the periphery of each unit lead frame by the laser beam is 0.25 mm or less and the width of the saw blade is 0.3 mm or greater.

4. The method of claim 3, wherein the width of the spaced apart cuts made in the periphery of each unit lead frame by the laser beam is 0.12 mm or less.

5. The method of claim 1, wherein processing the lead frame strip after forming the spaced apart cuts in the periphery of each unit lead frame comprises:

testing the semiconductor dies by probing the leads after the spaced apart cuts are formed in the periphery of each unit lead frame.

6. The method of claim 1, further comprising:

forming additional spaced apart cuts in the periphery of each unit lead frame using the laser beam, the additional spaced apart cuts severing tie bars which connect adjacent ones of the die paddles to the periphery of each unit lead frame and extending at least partially into the molding compound in regions of the periphery where the tie bars are located so that the molding compound remains intact between the additional spaced apart cuts, wherein the lead frame strip is processed after forming the additional spaced apart cuts in the periphery of each unit lead frame.

* * * * *